US006418336B1

(12) United States Patent
Kimmlingen et al.

(10) Patent No.: US 6,418,336 B1
(45) Date of Patent: Jul. 9, 2002

(54) MR TOMOGRAPHY APPARATUS AND METHOD FOR SUPPRESSING STIMULATION OF AN EXAMINATION SUBJECT

(75) Inventors: Ralph Kimmlingen; Franz Schmitt, both of Erlangen (DE)

(73) Assignee: Siemens Atiengesellschaft, Munich (DE)

( * ) Notice: Subject to any disclaimer, the term of this patent is extended or adjusted under 35 U.S.C. 154(b) by 0 days.

(21) Appl. No.: 09/632,789

(22) Filed: Aug. 4, 2000

(30) Foreign Application Priority Data

Aug. 5, 1999 (DE) .......................................... 199 37 065

(51) Int. Cl.[7] .............................................. A61B 5/055
(52) U.S. Cl. ........................ 600/410; 600/422; 324/318; 324/322
(58) Field of Search ................................ 324/307, 309, 324/318, 322; 600/410, 422; 128/901, 908

(56) References Cited

U.S. PATENT DOCUMENTS

| 4,165,479 A | 8/1979 | Mansfield |
| 5,309,107 A | 5/1994 | Pausch |
| 5,311,135 A | 5/1994 | Vavrek et al. |
| 5,497,773 A | * 3/1996 | Kuhara et al. |
| 5,736,858 A | 4/1998 | Katznelson et al. |
| 2001/0020120 A1 | * 9/2001 | Brand |

* cited by examiner

Primary Examiner—Ruth S. Smith
(74) Attorney, Agent, or Firm—Schiff Hardin & Waite

(57) ABSTRACT

In an MR tomography system and a method for operating an MR tomography system for the purpose of executing both fast and conventional measuring sequences with high image resolution without triggering stimulations in a living subject and with a high degree of freedom in the selection of imaging regions, a gradient coil is provided with at least two independently controllable potions, so that it is possible to set up gradient fields for a first imaging subregion and for a second imaging subregion that is not a subset of the first region and does not contain it, as well as an aggregate imaging region that contains at least the first and second imaging regions. The gradient fields for different regions can be set up in chronological succession, the various possibilities for setting up the gradient fields allows a selection dependent on the set measuring sequences to be determined prior to the execution of data acquisition with an examination subject present, so that stimulations do not occur in the actual execution of measuring sequences for image data acquisition.

11 Claims, 3 Drawing Sheets

MR TOMOGRAPHY APPARATUS AND METHOD FOR SUPPRESSING STIMULATION OF AN EXAMINATION SUBJECT

BACKGROUND OF THE INVENTION

1. Field of the Invention

The present invention relates to a magnetic resonance tomography device and to a method for operating a magnetic resonance tomography device, particularly for executing more rapid sequences with high image resolution without triggering stimulations in a living examination subject.

2. Description of the Prior Art

MR tomography is a known technique for acquiring images of the inside of the body of a living examination subject. To this end, rapidly switched magnetic gradient fields of high amplitude, which are generated by gradient coils, are superimposed on a static basic magnetic field.

In the process of picking up MR images, stimulations can be triggered in living examination subjects by the switching of the gradient fields. The gradient fields that influence the examination subject are characterized by a magnetic flux density that varies over time. The time-varying magnetic field generates eddy or induction currents in the examination subject. Their nature depends primarily on the shape and size of the microscopic structures. Due to electromagnetic interaction with tissue in the examination subject, these currents influence physiological currents, for instance potentials at cells. All cells have a resting potential. At resting potential, all membrane currents of a cell are in balance. When the membrane potential is depolarized by an additional membrane current which is introduced into the cell by an outside influence, for example, this causes a potential change, known as an action potential. The actuating potential for an action potential is called a threshold. At the threshold, the balance of the membrane currents changes. Additional currents temporarily appear, which depolarize the membrane. An action potential is accompanied by an action. Thus, for example, each contraction of a muscle fiber is accompanied by an action potential in the muscle fiber, and each reaction of a sensory cell to a sensory stimulus is relayed by action potentials. Accordingly, due to the triggering of action potentials, switched gradient fields can lead to stimulations that are experienced as uncomfortable by the examination subject.

There are known methods for predicting these stimulations. One of these methods for monitoring stimulations is based on the so-called "dB/dt model". In this method the values, which occur in an MR tomography process, of the time variation of magnetic flux density of gradient fields (dB/dt values) are checked and monitored. The maximum allowable dB/dt values arise as a result of a stimulation study with the corresponding gradient coils, or from limit values that have been strictly prescribed by regulatory authorities. Further details can be found in ("Peripheral Nerve Stimulation by Time-Varying Magnetic Fields" (J. Abart, er al; J. Computer Assisted Tomography (1997) 21 (4):532–8).

Another known approach to stimulation monitoring is known as the "Irnich model". This method describes the stimulation threshold as a function of the duration of the external influence. The period of influence is the time in which the amplitude of the gradient field changes in one direction; that is, dB/dt is permanently >0 or <0, respectively. A more detailed explanation can be found in the essay "Electrostimulation By Time-Varying Magnetic Fields" (W. Irnich, MAGMA (1994),2:43–49) and "Magnetostimulation in MRI" (W. Irnich, F. Schmitt, MRM (1995) 33:619–23).

Furthermore, German OS 42 25 592 teaches the prevention of stimulations of this sort by covering, with a closed conductor loop, regions of an examination subject outside the imaging volume that are sensitive to stimulation. This produces a reduction in the currents induced in the covered region. This method is based on the recognition that, given switched gradient fields, the highest current values are induced outside the imaging volume, and so the danger of stimulations is greatest there. Introducing conductor loops outside the imaging volume compromises the linearity of the gradient fields in the imaging region only inconsequently, which is important for image quality; however, given a change of the region of the subject that is to be imaged the position of the conductor loops must usually also be modified.

The triggering of stimulations thus depends basically on the type of measurement sequence. It is necessary to distinguish between sequences known as conventional measuring sequences and sequences known as rapid measuring sequences. Conventional measuring sequences usually demand a high linearity of the gradient fields within a definite linearity volume, for instance 5% in a linearity volume of 40 to 50 cm given moderate gradient strengths of 10 to 20 mT/m and switching times of approx. 1 ms. For the rapid measuring sequences, high gradients, for instance 20 to 40 mT/m, are switched very rapidly (switching times approx. 100 to 500 $\mu$s). The time-varying magnetic flux density of the gradient fields induces electrical currents in the examination subject, which can trigger stimulations of the subject. With faster time variations, that is, faster switching times and larger values of magnetic flux density of gradient fields, the induced currents are greater, and the probability of stimulations increases. The largest values in absolute terms are attained at the margins and outside the linearity volumes, where the maximum field deviation or excursion also occurs. Given defined requirements on the size of the gradients and the switching time, the field deviation, and thus the risk of stimulation, can be reduced by using a gradient coil with a smaller linearity volume. Thus, in rapid measuring sequences, the linearity volume of typically 40 to 50 cm drops to 20 cm, for example. A gradient coil with the above described characteristics for rapid measuring sequences typically is not suitable for conventional whole-body applications, but rather for rapid MR imaging techniques such as EPI (described in U.S. Pat. No. 4,165,479) and what are known as turbospin methods, such as the GRASE and HASTE methods.

The German OS 195 40 746 describes a modular gradient coil system that unites, in one coil body, a gradient coil for rapid measuring sequences and an activatable gradient coil for conventional measuring sequences. The gradient coil for rapid measuring sequences has a small linearity volume and allows rapid switching of gradient fields with large gradients. In the joint operation of the two coils, the gradient coil system has a large linearity volume for conventional measuring sequences with slowly switched gradient fields and given small gradients. This has the disadvantage that, with the selection of a rapid or conventional measuring sequence, an imaging region is defined corresponding to the appertaining linearity volume. The imaging region for rapid measuring sequences is always a definite small subregion, which is strictly prescribed by the coil arrangement, of the larger imaging region for conventional measuring sequences, with the midpoint of the two imaging regions being identical. To pick up MR images with rapid measuring sequences for an imaging region extending over the imaging region for conventional measuring sequences, the examination subject would have to be moved in all three directions in space. Due to the geometry of the MR tomography device, however, it is only possible to shift the examination subject in one direction.

Furthermore, U.S. Pat. No. 5,311,135 teaches a gradient coil for a magnetic resonance device which has four saddle-shaped coils, each of which has first and second terminal points respectively at the beginning and end of its conductor, as well as at least one tapping point between the terminal points. The arrangement also includes a switching mechanism, so that each of the coils can be supplied with current either between the terminal points or between the first terminal point and the tapping point. In this way, at least two different linearity volumes of the gradient coils can be set, for instance corresponding to a size of a region that is being imaged, as in German OS 195 40 746.

SUMMARY OF THE INVENTION

An object of the present invention is to provide an MR tomography device and a method for operating an MR tomography device, wherein the above described disadvantages of known systems and methods are alleviated.

This object is inventively achieved in an MR tomography system having a gradient coil with at least two independently controllable portions, a coil control device which controls the gradient coil, namely to control the coil portions thereof, and wherein the coil control device controls the gradient coil portions in at least one first control state for generating a gradient field for a first imaging subregion, and the coil control device controls the gradient coil portions in at least one second control state for generating a gradient field for a second imaging subregion, which is not a subset of the first imaging subregion and which does not contain it.

The above object also is inventively achieved in a method for operating an MR tomography system including the steps of controlling a gradient field in a first imaging subregion by controlling coil portions of a gradient coil containing at least two independently controllable portions, and controlling a gradient field in a second imaging subregion, which is not a subset of the first imaging subregion and which does not contain it.

By controlling gradient fields for at least two imaging subregions, with neither of the two regions being a subset of the other, it is possible to pick up MR images for a larger aggregate imaging area, which derives at least from the sum of the two imaging subregions, using rapid, high-resolution measuring sequences without triggering stimulations. In particular, the MR image scans can be performed for a region of a subject which has center, relative to the spatial directions in which the subject is constrained from movement due to the geometry of the MR tomography system, that does not coincide with the center of the aggregate image region. This also applies with respect to the spatial directions in which the subject can be moved (using the displaceable patient bed of the MR device), which creates the advantage that it is not necessary to displace the subject for these MR image scans. The term "gradient field" as used herein is a magnetic field extending in space that has a constant magnetic flux density gradient at least in the region of an imaging region for which it is generated.

In an embodiment, the coil control device can also control (operate) the gradient coil portions in at least one third control state for generating a gradient field for an aggregate imaging region which is defined by the gradient field of maximal extent that can be generated by the gradient coil and which contains all imaging subregions. In this way, conventional measuring sequences also can be executed for an aggregate imaging region of maximal extent, and are not restricted to one of the imaging subregions.

In a further embodiment, the coil control device controls the coil portions in a control state in which at least one coil portion, which is not contributing (at the moment) to the generation of a gradient field for an imaging subregion, generates a magnetic field whose values for magnetic flux density are not equal to the values exhibited by the gradient field within the imaging subregion. Under the assumption that the MR signals are picked up by a high-frequency receiving antenna that is designed for the aggregate imaging region, this embodiment prevents signals from regions outside a desired imaging subregion from having the same frequencies as signals from the desired imaging subregion, which would lead to falsification of the image.

In another embodiment, a test related to the triggering of stimulations is conducted on a set measuring sequence prior to its execution for image data acquisition. From the results of this test, a sequence format is determined for executing the set measuring sequence without triggering stimulations by controlling, in chronological succession, gradient fields for the aggregate imaging region, for one of the imaging subregions, or for at least two of the imaging subregions; and the determined format of execution is implemented for image data acquisition.

The testing of stimulation triggering is accomplished using one of the above described methods of stimulation prediction, for example. With the setting of a measuring sequence, among other things its time sequence, and thus the time characteristic of the gradient field, is strictly prescribed. In a further specified imaging region for slices that are being imaged, this prevents magnetic flux density of a gradient field extending beyond the specified imaging region, particularly at the edges of the imaging region, from exceeding defined limit values. A maximum size of the gradient, which simultaneously determines the maximum image resolution of an MR image, is thus specified. If the set measuring sequence demands a higher image resolution—i.e. a larger gradient—than can be achieved with the stimulation-related limit values, the measuring sequence can be executed with the desired image resolution while maintaining its time sequence, but for a smaller imaging region, since, given a smaller imaging region and the same limit values, it is possible to set a larger gradient without triggering stimulations.

In the context of the last described embodiment, this means that if, for a set measuring sequences, stimulations are expected given gradient fields that extend beyond the aggregate region, the set measuring sequence is executed with the desired image resolution with gradient fields for imaging subregions. An attempt is made to select an imaging subregion in such a way that all the set slices that are being imaged fall into this subregion. If the set slices being imaged extend over a broad area, it may be necessary to set gradient fields of corresponding gradient sizes for at least two imaging subregions in chronological succession. To do this, in a further embodiment the coil control device is designed to control operation so that a gradient field is initially set up in a first imaging subregion and then in a second imaging subregion in chronological succession.

DESCRIPTION OF THE PREFERRED EMBODIMENTS

Figure 1:
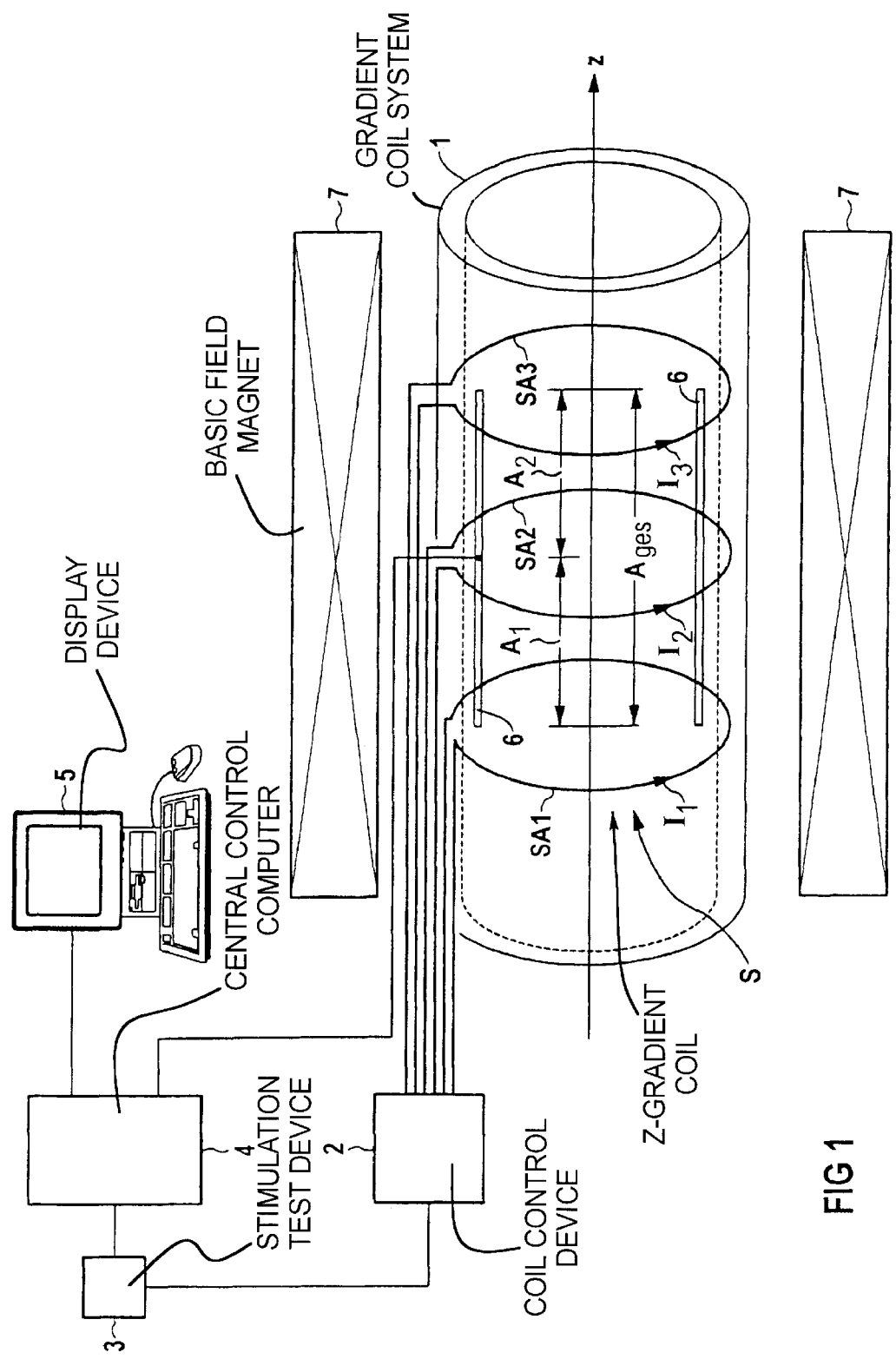
FIG. 1 is a schematic illustration of the basic components of an MR tomography system with a tubular gradient coil system having a z gradient coil comprising three coil portions, constructed and operating in accordance with the invention.

FIG. 1 shows an embodiment of the invention in the form of an MR system having a tubular gradient coil system 1. Only one z gradient coil S of the coil system 1 is represented in the example. The z gradient coil S exemplarily has three independently controllable portions SA1, SA2 and SA3. Only one winding for each coil portion SA1 to SA3 is exemplarily represented. In various embodiments, coil portions SA1 to SA3 can be spatially separated from each other or interleaved with each other. To precisely determine the arrangement of all conductor portions of such a gradient coil, an optimizing method is used, for instance a method such as described in German Patent 42 03 582. The totality of all coil portions SA1 to SA3 defines an aggregate imaging region $A_{ges}$. Two adjacent coil portions SA1 and SA2, and SA2 and SA3, define a first imaging subregion $A_1$ and a second imaging subregion $A_2$, respectively. The currents in the coil portions SA1 to SA3 are referenced $I_1$ to $I_3$. The flow directions (as indicated by the arrows) of the currents $I_1$, to $I_3$ are oriented in the same direction. The respective current flows in the individual coil portions SA1 to SA3 of the z gradient coil S is controlled by a coil control device 2. In the execution of measurement sequences, the coil control device 2 causes predeterminable currents of predeterminable direction to be supplied to the individual coil portions SA1 to SA3 or switches individual coil portions SA1 to SA3 out of the circuit. The coil control device 2 is additionally connected to a stimulation test device 3 and a central control computer 4. An operating and display device 5 is connected to the central control computer 4. At the operating and display device 5 the MR images are displayed, and measuring sequences are set which are to be executed by an operator, for example. In another embodiment, the stimulation test device 3 is an integral component of the central control computer 4 and is realized as a software module in the central control computer 4, for example. The basic field magnet 7 generates an optimally homogenous static basic magnetic field in the direction of the z axis, at least in the cylindrical opening of the tubular gradient coil system 1. The opening of the gradient coil system 1 is constructed to accept examination subjects. Furthermore, a high-frequency antenna 6 is arranged in the opening of the gradient coil system 1, which is designed to emit high-frequency impulses which trigger MR signals and to receive the MR signals from the aggregate imaging region $A_{ges}$. For generating corresponding images from the received MR signals and controlling the high-frequency impulses, this antenna is connected to the central control computer 4.

Prior to the execution of a measuring sequence, an operator sets the type of measuring sequence at the operating and display mechanism, usually via a menu. In this process, defined parameters of the measuring sequence can be selected by the operator. Examples of these parameters include slice orientation, repetition time, observation field (field of view), and image resolution. With the stipulation of a type of measuring sequence, the time sequence of the switched gradient fields is specified, among other things. Given a defined time sequence, the image resolution is dependent upon the size of the gradient, and with a predetermined field of view the imaging region is defined.

As explained above, the magnitude of the time variation of the magnetic flux density of a gradient field is critical to the triggering of stimulations. Assuming a defined time variation of a gradient field due to the selection of a type of measuring sequence, in order to suppress stimulations the gradient field may not exceed an absolute value of magnetic flux density. The largest values of magnetic flow density of a gradient field in absolute terms occur at is margins; that is, at the margins of the region being imaged. This means a relatively small gradient, i.e. a low image resolution, given fixed limit values of magnetic flux density and a gradient field for a large imageable region, or a large gradient, i.e. a high image resolution, given the same limit values and a small imaging region.

Upon setting a measuring sequence type and the above mentioned parameters, these setting data are also available in the central control computer 4. Prior to the execution of the set measuring sequence, the stimulation test device 3 accesses these data and checks how the stimulation-related settings, such as time sequence, image resolution and field of view, can be put into effect as desired without triggering stimulations. For example, the time sequence may be prescribed as an absolute given. The set field of view, or the slices to be imaged, determine an imaging region for which a gradient field with a gradient in accordance with the set image resolution must be switched. Here, the gradient field may not exceed limit values of magnetic flux density that are determined by the time sequence of the measuring sequence. The stimulation test device 3 is thus dedicated to testing whether, given a definite time sequence of a measuring sequence, the desired imaging region and the desired image resolution are achieved, without triggering stimulations, by the control of a gradient field for the aggregate imaging region $A_{ges}$, a gradient field for an imaging subregion $A_1$ or $A_1$, or gradient fields for both imaging subregions $A_1$ and $A_2$ in succession.

To explain the above, FIGS. 2 to 5 represent various gradient field characteristics along the z axis for various imaging regions and various sizes of the gradients resulting therefrom.

Figure 2:
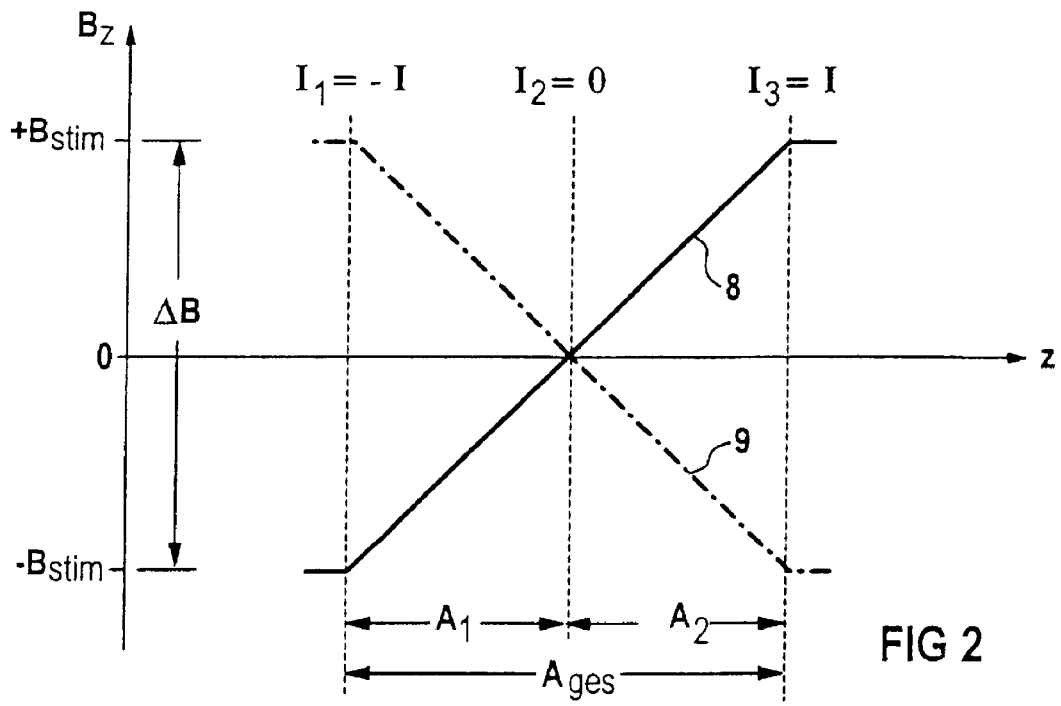
FIG. 2 shows gradient field characteristics of the gradient coils from FIG. 1 for an aggregate imaging region, constructed and operating in accordance with the invention.

FIG. 2 shows two idealized gradient field characteristics 8 and 9 extending over the aggregate imaging region $A_{ges}$ at different points in time. The time characteristic of the gradient field is determined by the measurement sequence that is set. So that no stimulations are triggered, the variation of magnetic flux density of the gradient field may not exceed a defined value $\Delta B$. The limit values of magnetic flux density $\pm B_{stim}$ and the maximum gradient in relative terms are also determined in this way. For setting the gradient field characteristic 8, the coil control device 2 controls the portions SA1 to SA3 of the gradient coil S, for instance in such a way that a current I flows in a first direction in the portion SA1, the current in the coil portion SA2 is zero, and the current I in the coil portion SA3 flows in the direction opposite the first direction. The size of the gradient in the aggregate imaging region $A_{ges}$, or in other words the slope of the curve of the gradient field characteristic in the aggregate imaging region $A_{ges}$, is a direct measure of the attainable resolution of a magnetic resonance image given a definite time sequence of a measuring sequence.

Figure 3:
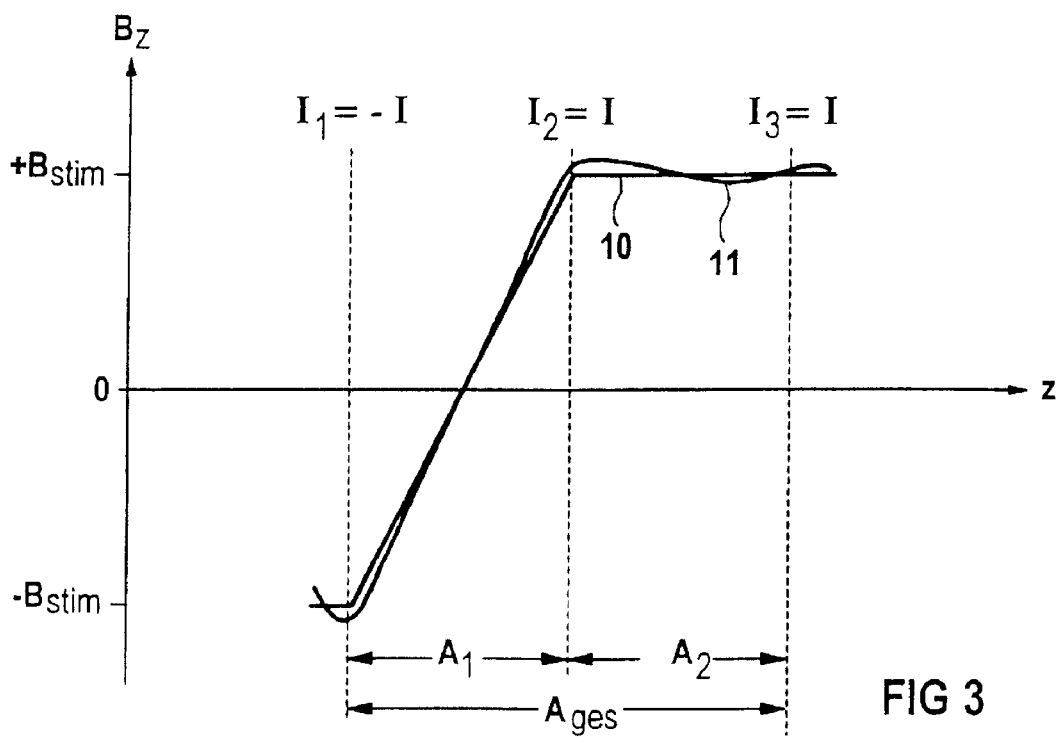
FIG. 3 shows gradient field characteristics of the gradient coils from FIG. 1 for a first imaging subregion, constructed and operating in accordance with the invention.

FIG. 3 shows characteristics of a real gradient field 11 and an idealized gradient field 10 along the z axis for the imaging subregion $A_1$. To this end, the coil control device 2 sets a current I in a first direction in the portion SA1 of the z gradient coil S and sets the current I in a direction opposite the first direction in the portion SA2 and in the portion SA3. The real gradient field characteristic 11 is also represented in FIG. 3, in order to demonstrate that, with a finite number of windings of a gradient coil, it will always only be possible to achieve a more or less good approximation of the idealized gradient field characteristic 10. For the sake of simplicity, the description relates to idealized gradient field characteristics, from which limitations for real gradient field characteristics do not derive. For the idealized gradient field characteristic 10 in FIG. 3, given the same time sequence of the measuring sequence from FIG. 2 the same stimulation-related limit values of magnetic flux density $\pm B_{stim}$ apply. The gradient of the gradient field thus set is appreciably larger within the imaging subregion $A_1$ compared to the gradient fields from FIG. 2. This means that MR images of slices of a subject located in the imaging subregion $A_1$ can be picked up with a higher image resolution compared to the gradient fields represented in FIG. 2. Proceeding from the high-frequency receiving antenna 6 that receives MR signals from the aggregate imaging region $A_{ges}$, a magnetic field is generated in the imaging subregion $A_2$ whose values for magnetic flux density are not equal to the values comprised by the gradient field within the imaging subregion $A_1$. This prevents undesirable signal contributions to the MR image from the imaging subregion $A_2$.

Figure 4:
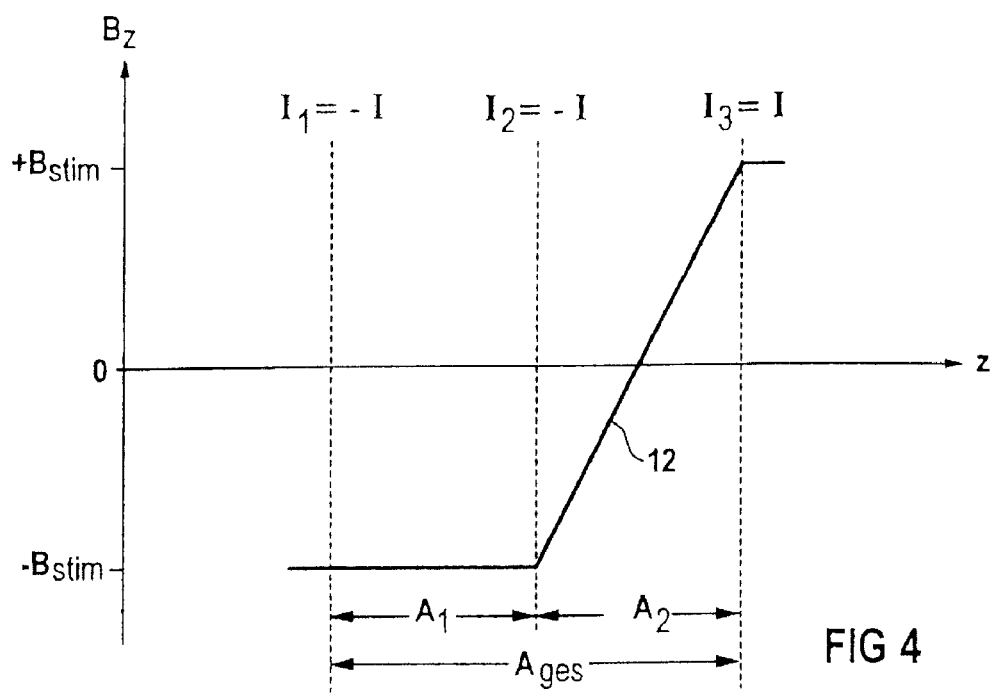
FIG. 4 shows a gradient field characteristic of the gradient coils from FIG. 1 for a second imaging subregion, constructed and operating in accordance with the invention.

FIG. 4 shows an idealized gradient field characteristic 12 for the imaging subregion $A_2$. The same applies to this gradient field 12 as to the gradient field 10 in FIG. 3. By successively switching gradient fields for the two imaging subregions $A_1$ and $A_2$, it is possible to achieve MR images with higher resolution for the aggregate imaging region $A_{ges}$ without having to move the examination subject.

Figure 5:
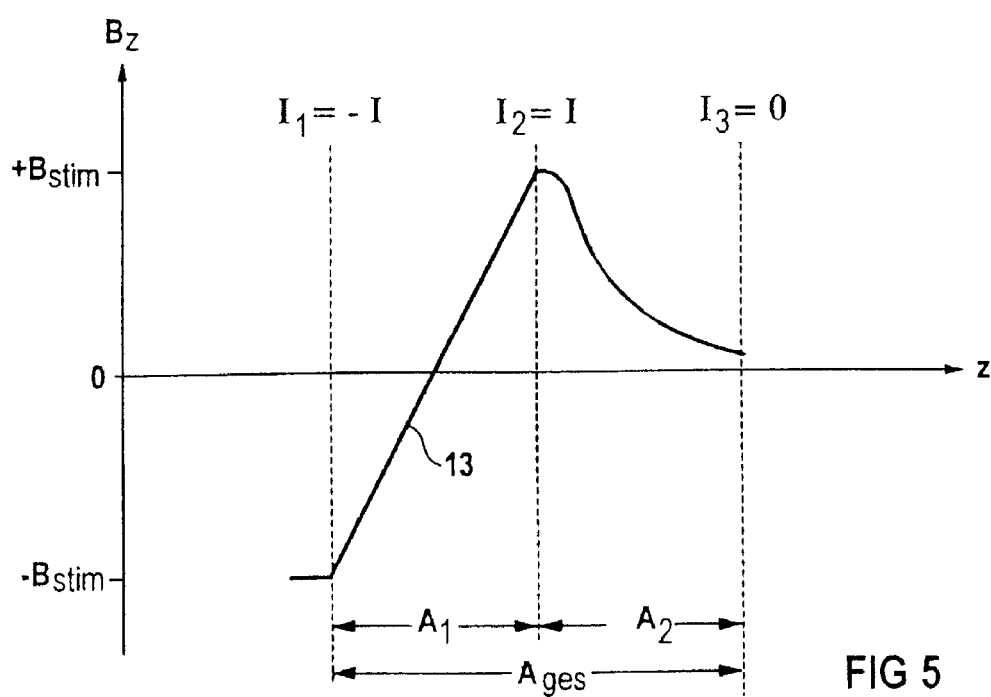
FIG. 5 shows another gradient filed characteristic of the gradient coil from FIG. 1 for the first imaging subregion, constructed and operating in accordance with the invention.

FIG. 5, like FIG. 3, shows another gradient field characteristic 13 for the imaging subregion $A_1$. For the imaging subregion $A_2$ a magnetic field of constant magnetic flux density is not set up; rather, magnetic flux density drops in a more or less indefinite manner, because unlike in FIG. 3 the coil portion SA3 does not have current I flowing therein, but is switched out of the circuit. The reception of MR signals using the high-frequency antenna 6 which is designed for the aggregate imaging region $A_{ges}$ would lead to a falsification of MR images from the imaging region $A_1$ as a result of the undesirable signal contributions from the imaging subregion $A_2$, because the indefinite magnetic field characteristic in the imaging subregion $A_2$ comprises the same values of magnetic flux density as the definite gradient field characteristic in the imaging subregion $A_1$. Given a gradient field characteristic 13 according to FIG. 5, unfalsified images of slices from the imaging subregion $A_1$ are achieved by working with a high-frequency antenna that is tuned specifically to the imaging subregion $A_1$, for example.

Although modifications and changes may be suggested by those skilled in the art, it is the intention of the inventors to embody within the patent warranted hereon all changes and modifications as reasonably and properly come with the scope of their contribution to the art.

We claim as our invention:

1. A magnetic resonance tomography system for executing fast measuring sequences for acquiring image data from a living subject with high image resolution, without triggering stimulations in said living subject, comprising:

a basic field magnet which generates a static basic magnetic field adapted to receive a living subject therein:

an RF system for exciting nuclear spins in said living subject and for receiving magnetic resonance signals resulting from said nuclear spins from said living subject;

a gradient coil comprising at least two independently controllable coil portions;

a coil control device connected to said gradient coil for controlling current flow in the respective coil portions; and said control device operating said gradient coil in a first control state for causing said coil portions to generate a gradient field in a first imaging region, and for operating said gradient coil in a second control state for causing said gradient coil portions to generate a gradient field in a second imaging region, wherein said second imaging region is not a subset of said first imaging region and said second imaging region does not contain said first imaging region.

2. A magnetic resonance tomography system as claimed in claim 1 wherein said coil control device operates said gradient coil in a third control state for causing said gradient coil portions to generate a gradient field in an aggregate imaging region, said aggregate imaging region being defined as a gradient field of maximum extent which can be generated by said gradient coil, and said aggregate imaging region containing said first imaging region and said second imaging region.

3. A magnetic resonance tomography system as claimed in claim 1 wherein said coil control device operates said gradient coil to generate respective current flows in at least two of said coil portions in opposite directions.

4. A magnetic resonance tomography system as claimed in claim 1 wherein said coil control device operates said gradient coil in a control state in which one of said coil portions does not contribute to generating a gradient field, said one of said control portions in said control state having no current therein.

5. A magnetic resonance tomography system as claimed in claim 1 wherein said coil control device operates said gradient coil so that at least one of said coil portions does not contribute to generating a gradient field and for causing said at least one of said coil portions to generate a magnetic field having a magnetic flux density value unequal to a magnetic flux density value of said gradient field within said first or second imaging region.

6. A magnetic resonance tomography system as claimed in claim 1 wherein said coil control device operates said gradient coil to cause said gradient coil portions to generate said gradient field in said first imaging region and said gradient field in said second imaging region in chronological succession.

7. A magnetic resonance tomography system as claimed in claim 1 further comprising:

a stimulation testing device connected to said coil control device;

said stimulation testing device testing a set measuring sequence with regard to triggering of stimulations and determining a format for executing a set measuring sequence, dependent on said test, without triggering stimulations, by controlling gradient fields in at least one of an aggregate imaging region composed of said first imaging region and said second imaging region, in at least one of said first imaging region and said second imaging region, and in said first imaging region and said second imaging region in chronological succession; and said stimulation testing device communicating said format to said coil control device and said coil control device operating said gradient coil for acquiring measurement data from said subject according to said format.

8. A method for operating a magnetic resonance tomography system for executing fast measuring sequences for acquiring image data from a living subject with high image resolution and without triggering stimulations in said living subject, comprising the steps of:

providing a gradient coil comprised of at least two independently controllable coil portions;

executing a data acquisition measurement sequence to acquire magnetic resonance image data from a living subject, including controlling a gradient field in a first imaging region by independently controlling said coil portions; and in said data acquisition measurement sequence, controlling a gradient field in a second imaging region by independently controlling said coil portions, wherein said second imaging region is not a subset of said first imaging region and wherein said second imaging region does not contain said first imaging region.

9. A method as claimed in claim 8 comprising the step of controlling a gradient field in an aggregate imaging region defined as a gradient field with a maximum extent which can be generated by said gradient coil, and which contains said first imaging region and said second imaging region.

10. A method as claimed in claim 8 comprising controlling the gradient field in one of said first imaging region and said second imaging region; and simultaneously controlling a magnetic field for remaining regions of an aggregate imaging region, said magnetic field having a magnetic flux density value which is unequal to a magnetic flux density value in said one of said first imaging region and said second imaging region.

11. A method as claimed in claim 8 comprising the additional steps of:

testing a set measuring sequence prior to executing said set measuring sequence for acquiring image data from said living subject with regard to whether said set measuring sequence triggers stimulations in said living subject;

determining a format for executing said set measuring sequence without triggering stimulation by controlling gradient fields in one of an aggregate imaging region composed of a sum of said first imaging region and said second imaging region, in one of said first imaging region and said second imaging region, and in said first imaging region in chronological succession with said second imaging region; and operating said gradient coil according to said format for executing said set measuring sequence to acquire image data from said living subject.

* * * * *